(12) United States Patent
Dietz et al.

(10) Patent No.: US 12,145,207 B2
(45) Date of Patent: Nov. 19, 2024

(54) SAW BLADE HAVING THIN FILM CERAMIC COATING

(71) Applicant: MILWAUKEE ELECTRIC TOOL CORPORATION, Brookfield, WI (US)

(72) Inventors: Carl Dietz, Menomonee Falls, WI (US); Milorad Marich, Brookfield, WI (US); Chris Gilbert, Milwaukee, WI (US)

(73) Assignee: MILWAUKEE ELECTRIC TOOL CORPORATION, Brookfield, WI (US)

( * ) Notice: Subject to any disclaimer, the term of this patent is extended or adjusted under 35 U.S.C. 154(b) by 814 days.

(21) Appl. No.: 17/051,222

(22) PCT Filed: Jul. 20, 2020

(86) PCT No.: PCT/US2020/042813
§ 371 (c)(1),
(2) Date: Oct. 28, 2020

(87) PCT Pub. No.: WO2021/016202
PCT Pub. Date: Jan. 28, 2021

(65) Prior Publication Data
US 2023/0311222 A1    Oct. 5, 2023

Related U.S. Application Data

(60) Provisional application No. 62/878,601, filed on Jul. 25, 2019, provisional application No. 62/876,319, filed on Jul. 19, 2019.

(51) Int. Cl.
*B23D 61/14* (2006.01)
*B23D 61/12* (2006.01)
(Continued)

(52) U.S. Cl.
CPC .......... *B23D 61/14* (2013.01); *B23D 61/125* (2013.01); *B23D 61/127* (2013.01);
(Continued)

(58) Field of Classification Search
CPC .... B23D 61/14; B23D 61/125; B23D 61/127; B23D 61/121; B23D 61/123;
(Continued)

(56) References Cited

U.S. PATENT DOCUMENTS

| | | |
|---|---|---|
| 4,643,620 A | 2/1987 | Fujii et al. |
| 4,755,399 A | 7/1988 | Fujii et al. |

(Continued)

FOREIGN PATENT DOCUMENTS

| | | |
|---|---|---|
| CN | 105328268 A | 2/2016 |
| CN | 105478905 A | 4/2016 |

(Continued)

OTHER PUBLICATIONS

Extended European Search Report for Application No. 20843959.6 dated May 30, 2023 (8 pages).

(Continued)

*Primary Examiner* — Ghassem Alie
(74) *Attorney, Agent, or Firm* — Michael Best & Friedrich LLP

(57) ABSTRACT

A saw blade including a body and a plurality of teeth disposed on the body and defining a cutting portion. At least one tooth of the plurality of teeth have a substrate forming a tip of the at least one tooth. The saw blade further includes a thin film ceramic coating overlaying at least the substrate. The thin film ceramic coating has a greater strength than the substrate.

18 Claims, 11 Drawing Sheets

(51) Int. Cl.
*C23C 14/06* (2006.01)
*C23C 14/24* (2006.01)
*C23C 14/34* (2006.01)

(52) U.S. Cl.
CPC .......... *C23C 14/0641* (2013.01); *C23C 14/24* (2013.01); *C23C 14/34* (2013.01)

(58) Field of Classification Search
CPC ..... C23C 14/0641; C23C 14/24; C23C 14/34; Y10T 83/9319; Y10T 83/9317; Y10T 83/9358; Y10T 83/935
USPC .......... 83/835, 661, 851, 848, 846, 852–855
See application file for complete search history.

(56) References Cited

U.S. PATENT DOCUMENTS

| | | | |
|---|---|---|---|
| 5,431,072 A | 7/1995 | Christoffel | |
| 6,733,874 B2 | 5/2004 | Ueda et al. | |
| 6,835,446 B2 | 12/2004 | Ueda et al. | |
| 7,131,365 B2 | 11/2006 | Hall et al. | |
| 7,322,776 B2 | 1/2008 | Webb et al. | |
| 7,644,763 B2 | 1/2010 | Peter | |
| 7,824,134 B2 | 11/2010 | Webb et al. | |
| 8,124,222 B2 | 2/2012 | Myrtveit | |
| RE43,287 E | 4/2012 | Hall et al. | |
| 8,210,081 B2 * | 7/2012 | Elliston | B23D 61/121 83/846 |
| 8,288,019 B2 | 10/2012 | Nagano et al. | |
| 10,179,366 B2 | 1/2019 | Minami et al. | |
| 10,279,408 B2 | 5/2019 | Rakurty et al. | |
| 11,583,945 B2 | 2/2023 | Green et al. | |
| 2002/0170407 A1 | 11/2002 | Turfitt et al. | |
| 2005/0235799 A1 * | 10/2005 | Hampton | B23D 51/08 83/835 |
| 2006/0010696 A1 * | 1/2006 | Critelli | B23D 61/125 30/506 |
| 2006/0225553 A1 * | 10/2006 | Hasegawa | C23C 30/005 83/835 |
| 2007/0163392 A1 * | 7/2007 | Kullmann | B27B 33/02 83/835 |
| 2007/0207715 A1 | 9/2007 | Webb | |
| 2008/0121084 A1 | 5/2008 | Vogel et al. | |
| 2008/0052922 A1 | 6/2008 | Balint | |
| 2009/0126541 A1 | 5/2009 | Pretorius et al. | |
| 2009/0148249 A1 | 6/2009 | Pretorius et al. | |
| 2009/0169910 A1 | 7/2009 | Myrtveit | |
| 2009/0293696 A1 | 12/2009 | Rauscher et al. | |
| 2010/0040423 A1 | 2/2010 | Omori et al. | |
| 2010/0122620 A1 * | 5/2010 | Ruthven | B23D 61/028 427/284 |
| 2011/0154970 A1 * | 6/2011 | Oshibe | B23D 61/121 83/835 |
| 2012/0000338 A1 * | 1/2012 | Elliston | B23B 51/04 83/697 |
| 2012/0144680 A1 | 6/2012 | Scillia et al. | |
| 2014/0150620 A1 * | 6/2014 | Elliston | B23D 61/127 83/835 |
| 2014/0251100 A1 | 9/2014 | Pretorius et al. | |
| 2014/0260880 A1 * | 9/2014 | Hampton | B23D 61/123 83/835 |
| 2015/0135915 A1 * | 5/2015 | Mann | B23D 61/006 83/13 |
| 2016/0158858 A1 | 6/2016 | Green et al. | |
| 2018/0099341 A1 | 4/2018 | Rakurty et al. | |
| 2020/0180054 A1 | 6/2020 | Sanogo et al. | |

FOREIGN PATENT DOCUMENTS

| | | | | |
|---|---|---|---|---|
| CN | 107263737 A | | 10/2017 | |
| CN | 107262824 B | | 12/2018 | |
| DE | 202013100984 U1 | | 3/2014 | |
| EP | 1675711 B1 | | 5/2014 | |
| JP | 2010280022 A | * | 6/2009 | ............. B23D 61/14 |

OTHER PUBLICATIONS

International Search Report and Written Opinion for Application No. PCT/US2020/042813 dated Oct. 27, 2020 (11 pages).

Sarwar et al., "Performance of titanium nitride-coated carbide-tipped circular saws when cutting stainless steel and mild steel," 1997, Surface and Coatings Technology, vols. 94-95, pp. 617-621.

Pro Tool Innovation, "Winner—Recip Saw Blades, Lenox LAZER CT Carbide Tipped Reciprocating Saw Blade," excerpt retrieved from: <https://protoolinnovationawards.com/winners/2019-pro-tool-innovation-awards/2019-accessories/> web page publicly available at least as early as Oct. 27, 2020.

* cited by examiner

SAW BLADE HAVING THIN FILM CERAMIC COATING

REFERENCE TO RELATED APPLICATIONS

This application is a national phase filing under 35 U.S.C. 371 of International Application No. PCT/US2020/042813 filed Jul. 20, 2020, which claims priority to prior filed U.S. Provisional Patent Application Nos. 62/876,319, filed on Jul. 19, 2019, and 62/878,601, filed on Jul. 25, 2019, the entire contents of which are incorporated by reference herein.

FIELD OF THE DISCLOSURE

The present invention relates to coatings for cutting implements, such as saw blades. More particularly, the present invention relates to thin film ceramic coatings for saw blades.

SUMMARY OF THE DISCLOSURE

According to one aspect, the invention provides a saw blade including a body and a plurality of teeth disposed on the body and defining a cutting portion. At least one tooth of the plurality of teeth have a substrate forming a tip of the at least one tooth. The saw blade further includes a thin film ceramic coating overlaying at least the substrate. The thin film ceramic coating has a greater strength than the substrate.

According to another aspect, the invention provides a saw blade includes a body having an edge, and a cutting portion coupled to the body and including a plurality of teeth extending along the edge. Each tooth has a rake face, a relief face, a gullet, and a lip. The saw blade further includes a plurality of substrates, wherein each substrate is coupled to the lip of one of the plurality of teeth to form a tip of the one of the plurality of teeth. The saw blade further includes a thin film ceramic coating overlaying a portion of the cutting portion, such that at least the rake face, the relief face, the gullet, the lip, and the substrate of each tooth are covered by the thin film ceramic coating. The thin film ceramic coating has a greater strength than the substrate. The substrate is composed of tungsten carbide alloy having a sub-micron grain size. The thin film ceramic coating has a thickness between approximately 3.0 micrometers and approximately 4.0 micrometers.

According to another aspect, the invention provides a method for manufacturing a saw blade including forming a body and a plurality of teeth, securing a substrate to at least one of the plurality of teeth, and applying a thin film ceramic coating over at least the substrate. The thin film ceramic coating has a greater strength than the substrate.

Before any constructions of the invention are explained in detail, it is to be understood that the invention is not limited in its application to the details of construction and the arrangement of components set forth in the following description or illustrated in the following drawings. The invention is capable of other constructions and of being practiced or of being carried out in various ways.

DETAILED DESCRIPTION

Figure 1:
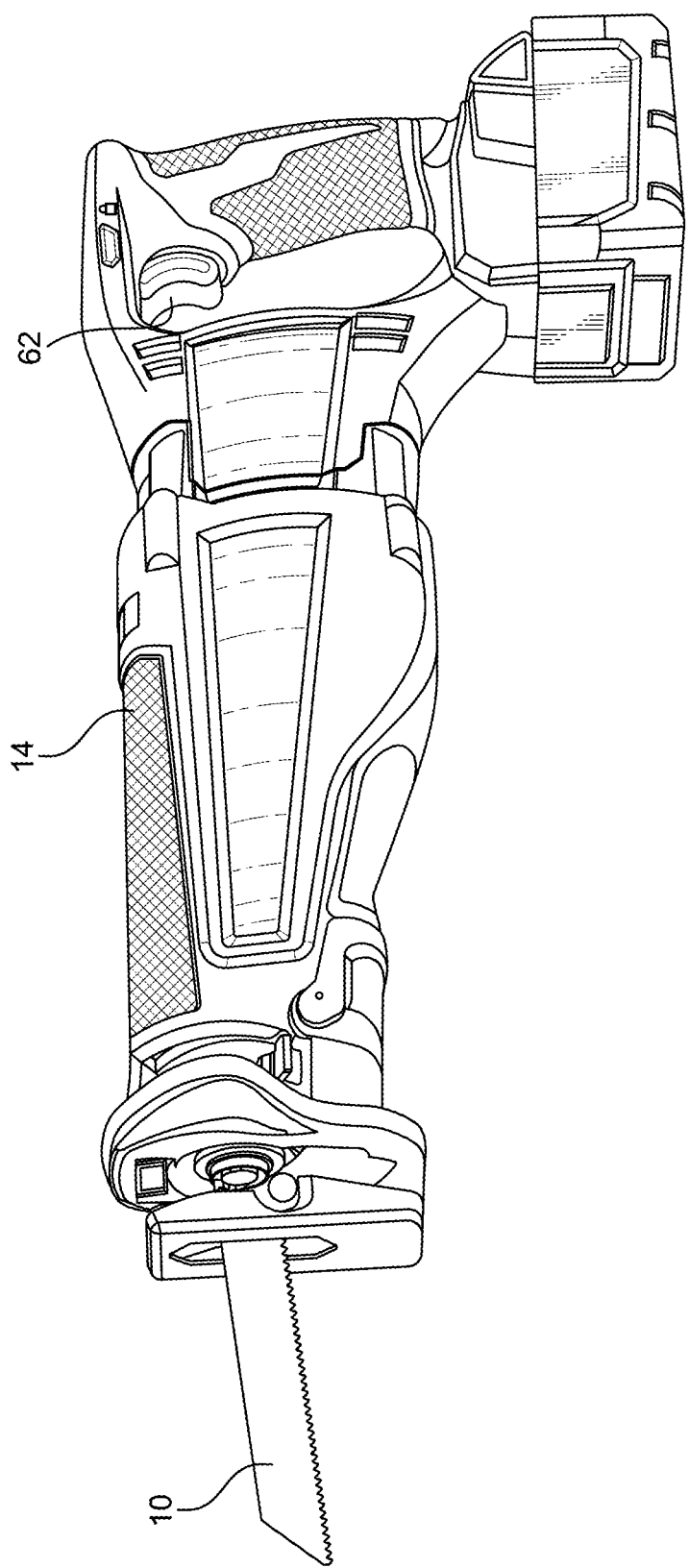
FIG. 1 is a perspective view of a reciprocating saw with a reciprocating saw blade.
Figure 2:
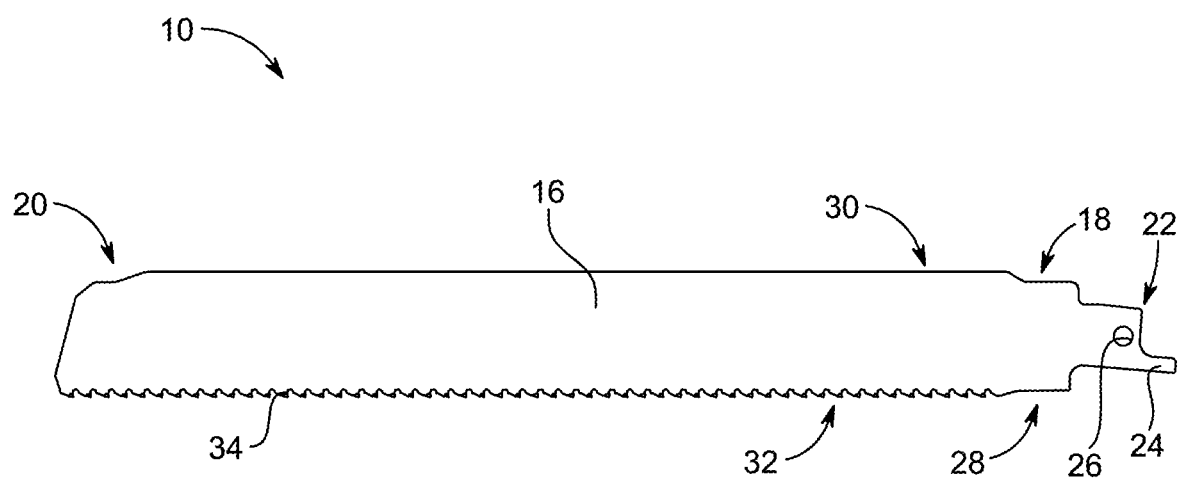
FIG. 2 is a side view of the reciprocating saw blade of FIG. 1.

FIGS. 1 and 2 illustrate a cutting tool and, more particularly, a cutting implement that can be selectively coupled to a power tool 14. In particular, the cutting implement is a reciprocating saw blade 10 selectively couplable to a reciprocating saw 14. In some embodiments, the cutting tool can be a different cutting implement selectively couplable to a different power tool. In other embodiments, the cutting tool may not be coupled to a power tool.

Figure 3A:
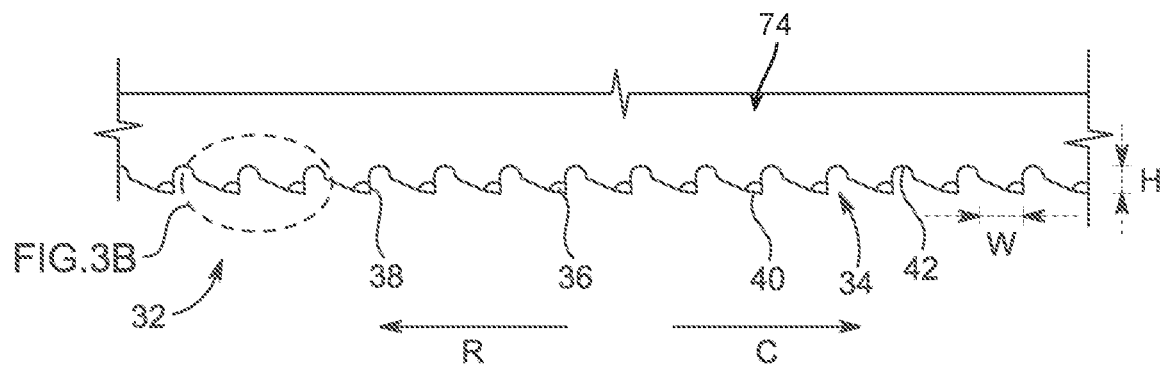
FIG. 3A is an enlarged view of teeth of the reciprocating saw blade of FIG. 2
Figure 3B:
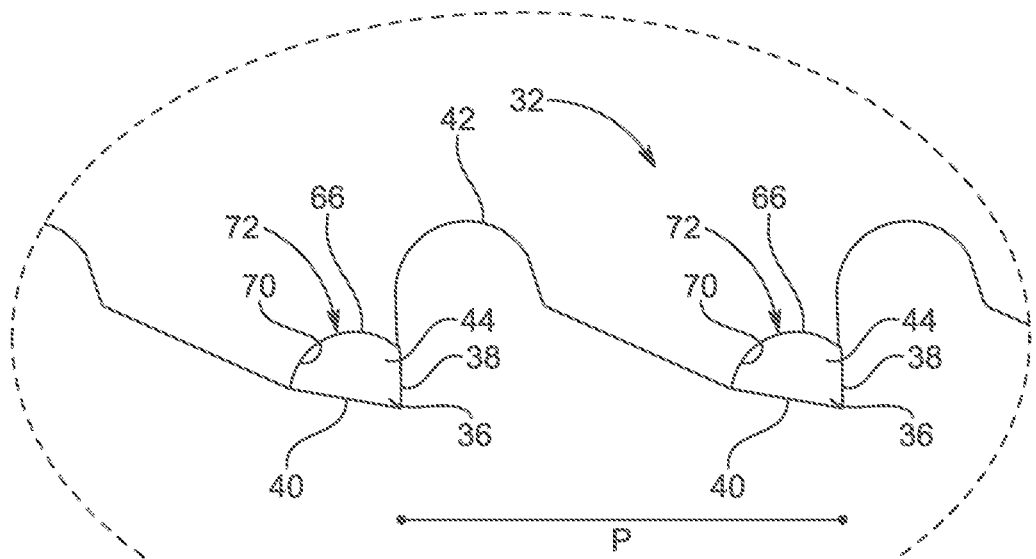
FIG. 3B is a detailed view of the teeth of the reciprocating saw blade of FIG. 2.

With reference to FIGS. 2-3B, the reciprocating saw blade 10 includes a body 16 having a first end 18 and a second, distal end 20 opposite the first end 18. The first end 18 includes an attachment portion 22 that is coupled to the first end 18 of the body 16. The illustrated attachment portion 22 includes a tang 24 and an aperture 26 for coupling the reciprocating saw blade 10 to the reciprocating saw 14 (FIG. 1). In other embodiments, the attachment portion 22 may include other suitable structures for coupling the saw blade 10 to the reciprocating saw 14 or other types of saws. The saw blade 10 further includes a first edge 28 and a second edge 30 disposed opposite the first edge 28. Both the first and second edges 28, 30 extend between first and second ends 18, 20. The first edge 28 includes a cutting portion 32 that extends substantially along the entire length of the body 16. In the illustrated embodiment, the cutting portion 32 is integrally formed as a single piece with the body 16. In particular, the cutting portion 32 is formed monolithically with the first edge 28. In other embodiments, the cutting portion 32 may be a separate piece that is secured to the first edge 28 of the body 16. For example, the reciprocating saw blade 10 may be a bi-metal blade where the body 16 is formed of a first material and the cutting portion 32 is formed of a second material. The second material may be the same as the first material or may be a different (e.g., harder) material than the first material.

The illustrated cutting portion 32 includes a plurality of recurrent or repetitive cutting teeth 34. The cutting teeth 34 form a linear cutting edge on the body 16. In some embodiments, the cutting edge may be non-linear (e.g., curved, angled, discontinuous, etc.). In the illustrated embodiment, each tooth 34 is generally the same shape and size. In other embodiments, the shape and/or size of the teeth 34 may vary along the length of the cutting portion 32. Each tooth 34 includes a tip 36, a rake face 38, and a relief face 40. The cutting teeth 34 are separated from each other by a plurality of gullets 42. Each tooth 34 is spaced a pitch P from an adjacent tooth 34. The pitch P is measured between tips 36 of adjacent teeth 34. In the illustrated embodiment, the pitch P of the cutting teeth 34 is generally the same along the length of the cutting portion 32. In other embodiments, the pitch P may vary. Each tooth 34 has a width W measured in a direction generally parallel to the first edge 28 of the body 16. The width W extends from the rake face 38 to an opposite end of the relief face 40. Each tooth 34 also has a height H measured in a direction generally perpendicular to the first edge 28 of the body 16. The height H extends from the tip 36 to a base of the corresponding gullet 42. During operation, the reciprocating saw blade 10 is reciprocated in a cutting direction C and a return direction R to cut through a work piece.

In some embodiments, the reciprocating saw blade 10 includes a substrate 44 coupled to one or more of the cutting teeth 34. The substrate 44 may also be referred to as a cutting insert. The substrate 44 may form part of the tooth 34 (e.g., the tip 36 and portions of the rake and relief faces 38, 40) or may form the entire tooth 34. In the illustrated embodiment, the substrate 44 is secured to a portion of the tooth 34. The substrate 44 of the illustrated embodiment is applied discontinuously over the entire cutting portion 32, such that adjacent substrates 44 are spaced apart from each other. In some embodiments, the substrate 44 is brazed onto the tooth 34 of the saw blade 10. For example, the substrate 44 includes a curved edge 66 that mates with a corresponding lip 70 of each tooth 34. Specifically, the substrate 44 is received by a pocket 72 provided on each tooth 34. Once the substrate 44 is aligned on the tooth 34, the substrate 44 may be brazed and subsequently grinded, permanently coupling the substrate 44 to the tooth 34. In additional embodiments, the substrate 44 may be secured to the tooth 34 via an alternative process.

In the illustrated embodiment, the substrate 44 includes carbide. In other embodiments, the substrate 44 may be composed of alternate substances. The carbide may be composed of tungsten carbide and cobalt. By increasing the cobalt content of the carbide, the substrate 44 has an increased toughness. Unfortunately, increasing the cobalt content of the carbide also reduces hardness and wear resistance of the substrate 44. Therefore, the grain size of the carbide is reduced in order to counteract the reduced toughness and hardness as a result of carbide presence. By decreasing the grain size of the carbide, the grain structure offers a large surface area on which to bind, thereby permitting a high binding metal content which increases hardness and creates a high toughness. In some embodiments, the grain size of the carbide is an extra-fine grain cemented carbide known as H6F grade carbide. H6F grade carbide is a tungsten carbide alloy having a sub-micron grain size (e.g., a grain size of approximately 0.8 micrometers). H6F grade carbide includes approximately 6% cobalt and 94% tungsten carbide. In other embodiments, the carbide may be a H10F grade carbide, composed of 10% cobalt and 90% tungsten carbide. Similar to H6F grade carbide, H10F grade carbide includes a grain size of approximately 0.8 micrometers, which is precisely controlled. In further embodiments, the carbide may be a H15F grade carbide, composed of 15% cobalt and 85% tungsten carbide. Similar to H6F and H10F grade carbides, H15F grade carbide includes a grain size of approximately 0.8 micrometers, which is precisely controlled. H6F, H10F, and H15F grade carbides provide a combination of strength and toughness for applications where high toughness and sharp edge profiles are desired, such as the reciprocating saw blade 10. In additional embodiments, the substrate 44 may be disposed on additional locations on the reciprocating saw blade 10.

In some embodiments, the reciprocating saw blade 10 is edge prepped. Edge prepping includes removing sharp edges, corners, and weld pools from the substrate 44. Particularly, edge prepping refines the micro geometry of the cutting teeth 34 of the reciprocating saw blade 10. As a result of edge prepping the substrate 44, the amount of stress risers and blunts on the cutting edge of each tooth 34 is reduced. Stress risers are peaks that are inadvertently developed during the manufacturing process of the reciprocating saw blade 10. The stress risers amplify stress during machining, thereby decreasing the lifespan of the reciprocating saw blade 10. Similarly, a sharp cutting edge creates a lever that may convert force during cutting into tensile stress on the reciprocating saw blade 10. These additional stresses may cause the substrate 44 (particularly carbide substrates) to fracture, compromising the integrity of the substrate 44 and/or exposing the substrate 44. In alternative embodiments, the substrate 44 may not be edge prepped.

Figure 4:
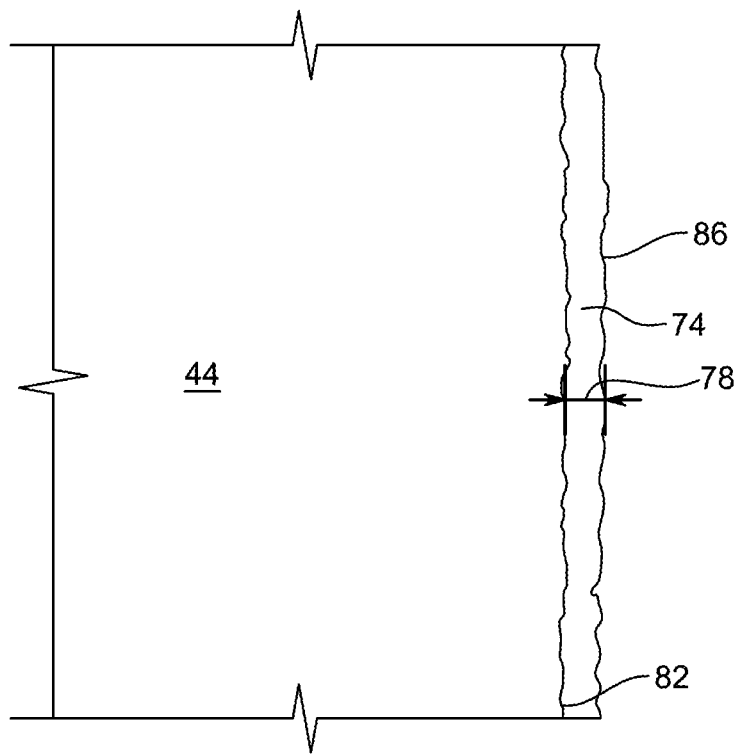
FIG. 4 is an enlarged view of a cutting edge of the reciprocating saw blade of FIG. 2, illustrating a coating applied to a cutting edge.
Figure 5:
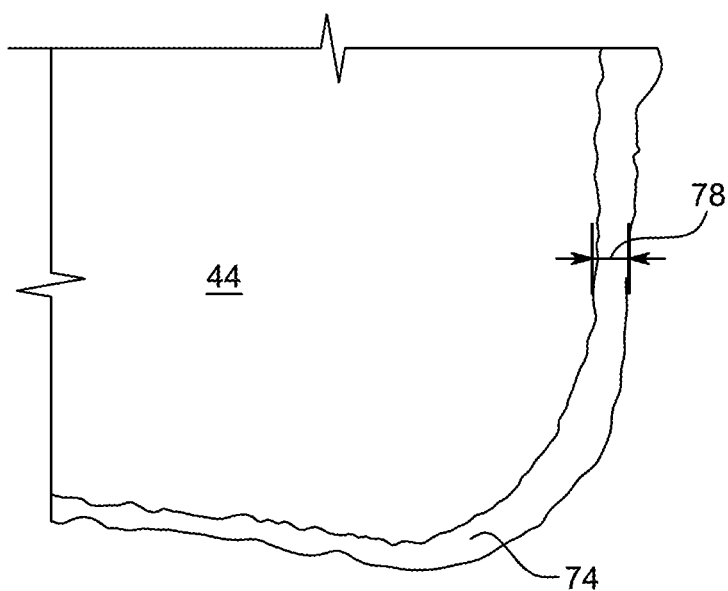
FIG. 5 is another enlarged view of the cutting edge of the reciprocating saw blade of FIG. 2, illustrating the coating applied to the cutting edge.

Referring to FIGS. 4 and 5, the reciprocating saw blade 10 further includes a coating 74. In the illustrated embodiment, the coating 74 is a thin film ceramic coating. In some embodiments, the coating 74 may be disposed on only the substrates 44 coupled to the teeth 34. In other embodiments, the coating 74 may be disposed on the entirety of each tooth 34. In still other embodiments, the coating 74 may be disposed on the entire reciprocating saw blade 10, including the teeth 34 and the body 16. The coating 74 overlays the substrate 44, such that the substrate 44 acts as the weak point due to the coating 74 being significantly stronger than the substrate 44. In other words, failure or degradation of the substrate 44 may cause the coating 74 to also fail.

In some embodiments, the coating 74 is composed of aluminum titanium nitride (AlTiN). The AlTiN coating increases oxidation resistance at elevated temperatures due to the formation of a protective aluinuim-oxide layer at the surface. In addition, the AlTiN coating increases hardness in deposited films due to micro-structure changes and solid solution hardening. Further, the AlTiN coating age hardens at temperatures typical during operation of the reciprocating saw blade 10. In other embodiments, the coating 74 is composed of aluminum chromium nitride (AlCrN). The AlCrN coating includes a high hot hardness with high wear resistance in extreme mechanical stresses. The AlCrN coating is particularly beneficial at high speed applications, such as those experienced by the reciprocating saw blade 10. In further embodiments, the coating 74 is composed of aluminum titanium chromium nitride (AlTiCrN). The AlTiCrN coating includes a high hardness, toughness, and oxidation temperature. The AlTiCrN coating is particularly beneficial for machining hardened steels, stainless steels, superalloys, and other difficult to machine materials. Still, in other embodiments, the coating 74 is composed of a titanium-based material. For example, the coating 74 is composed of titanium molybdenum nitride (TiMoN). The TiMoN coating is a ceramic material.

In the illustrated embodiment, the coating 74 has a thickness 78 measured between an outer surface 82 of the substrate 44 (or cutting tooth 34) and an outer surface 86 of the coating 74. In some embodiments, the thickness 78 of the coating 74 is at least 2.0 micrometers. In other embodiments, the thickness 78 of the coating 74 is at least 3.0 micrometers. In still other embodiments, the thickness 78 of the coating 74 is between 2.0 and 5.0 micrometers. In other embodiments, the thickness 78 of the coating 74 is between 3.0 and 4.0 micrometers. In the illustrated embodiment, the thickness 78 of the coating 74 is about 3.5 micrometers. At locations in which edge prep has been performed, the thickness 78 of the coating 74 may vary.

In some embodiments, the coating 74 may be applied via physical vapor deposition (PVD), which is a variety of vacuum deposition methods. PVD is a process in which a material, such as the coating 74, goes from a condensed phase, to a vapor phase, and subsequently back to a thin film condensed phase, producing a thin film or coating. In some embodiments, the PVD process may include evaporation, in which vapor particles of the coating 74 travel directly to the substrate, where the particles condense back to a solid state. In other embodiments, the PVD process may include sputtering, in which a thin film is deposited from a source onto the substrate. In further embodiments, the coating 74 may be applied via additional methods such as hot-dip galvanizing, thermal spraying, electroplating, sherardizing, and the like.

Figure 6:
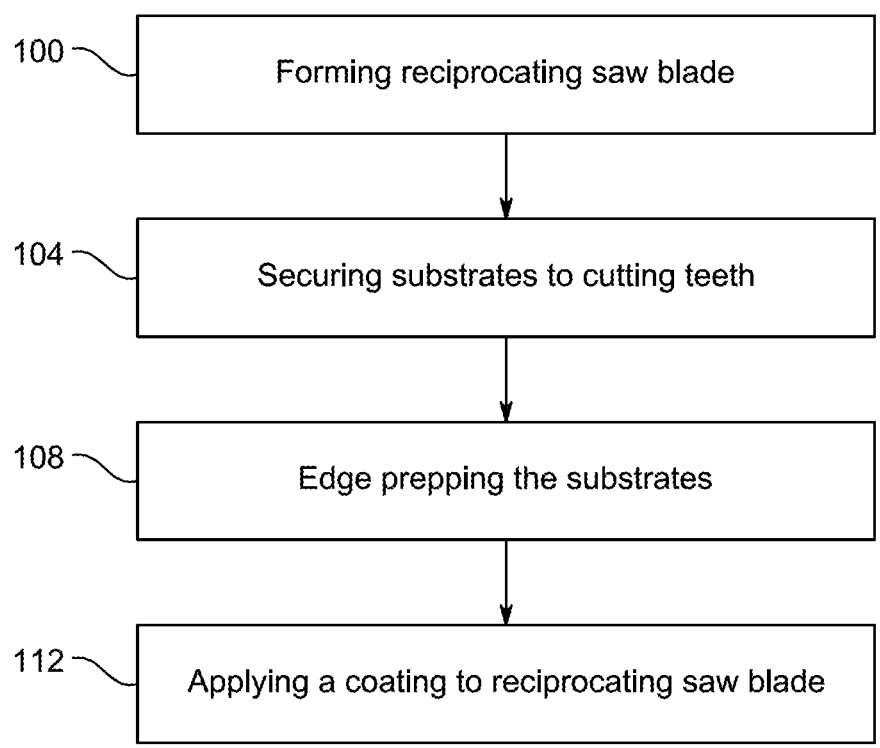
FIG. 6 is a flow chart of the manufacturing process of the reciprocating saw blade of FIG. 2 for applying a coating to the cutting edge.

FIG. 6 illustrates the manufacturing process of the present embodiment. During step 100, the reciprocating saw blade 10 is formed to include the body 16 and the teeth 34. The body 16 and the teeth 34 of the reciprocating saw blade 10 are formed from, for example, coil stock via stamping, laser cutting, grinding, or the like.

During step 104, the substrates 44 are secured onto the teeth 34. Each substrate 44 may be secured onto each of the teeth 34 via brazing or welding. As a result of welding the substrate 44 on each tooth 34, a weld pool may form on each tooth 34, which is subsequently removed as a part of edge prepping the substrate 44 and teeth 34. In some embodiments, the substrates 44 may be secured onto the teeth 34 via an adhesive or other suitable securing means. The substrates 44 may be formed into their desired shapes prior to or after being secured to the teeth 34.

During step 108, the substrates 44 may be edge prepped. Edge prepping the substrates 44 may include removing sharp edges and curves of the substrate 44 and the teeth 34 via grinding or polishing the tips of the substrate 44 and teeth 34. In some embodiments, edge prepping of the substrates 44 may not occur.

During step 112, the coating 74 is applied to the reciprocating saw blade 10. In some embodiments, the coating 74 may be applied to solely the substrates 44. In other embodiments, the coating 74 may be applied to each tooth 34 including the substrate 44, but not including the body 16 of the reciprocating saw blade 10. In further embodiments, the coating 74 may be applied to the entire cutting portion 32, but not including the body 16 of the reciprocating saw blade 10. In additional embodiments, the coating 74 may be applied to the entirety of the reciprocating saw blade 10, including the body 16. The coating 74 may be applied to portions of the reciprocating saw blade 10 via the PVD process, hot-dip galvanizing, thermal spraying, electroplating, sherardizing, or the like.

FIGS. 7A-9B include graphical illustrations depicting the effects different coatings 74 have on the performance of the reciprocating saw blade 10. Although not explicitly depicted in the graphs, different combinations of types of substrates with different coatings 74 may also affect the performance of the reciprocating saw blade 10.

Figure 7A:
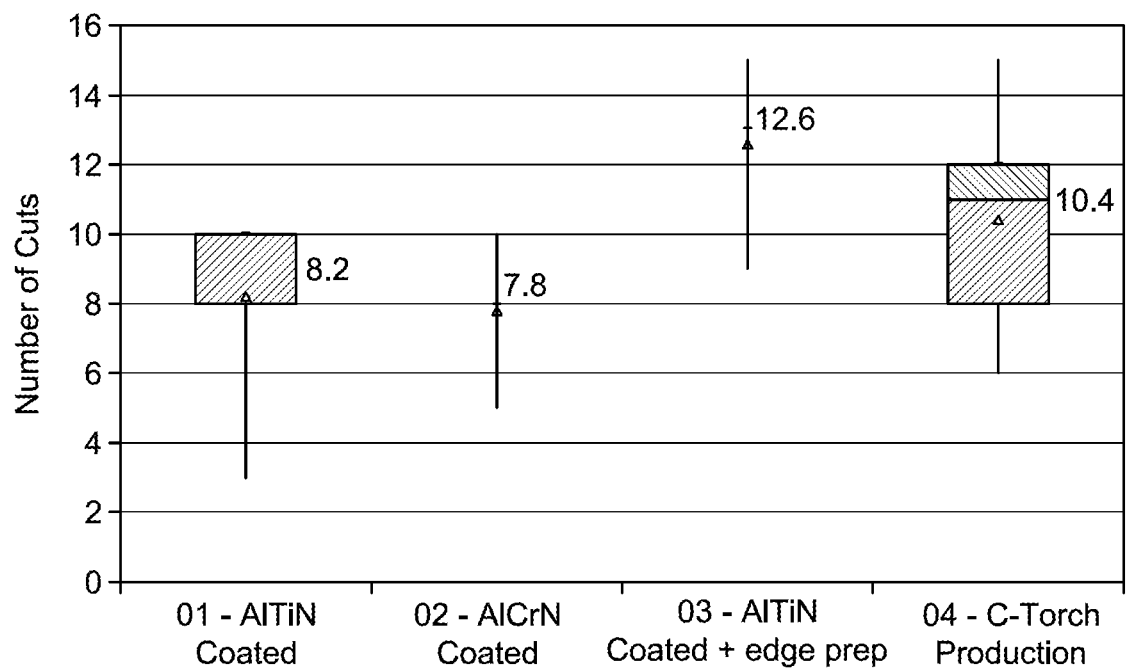
FIG. 7A is a graphical illustration of the lifetime of the reciprocating saw blade with different coatings when being used to cut stainless steel objects.

FIG. 7A illustrates a graph of the performance of the reciprocating saw blade 10 when the reciprocating saw blade 10 is used with the reciprocating saw at full speed to cut a stainless steel pipe. Specifically, FIG. 7A shows how the life, or degradation, of the reciprocating saw blade 10 is affected by having differing coatings 74 applied to the reciprocating saw blade 10. The average number of cuts that the reciprocating saw blade 10 without the coating 74 ("04-C-Torch Production") can perform on the stainless steel pipe before significant wear occurs on the reciprocating saw blade 10 is approximately 10.4 cuts. This can be compared with the highest performing coating 74, which was the AlTiN coating with edge prepping of the substrate 44 ("03-AlTiN Coate+edge prep"). The average number of cuts within the lifetime of the reciprocating saw blade 10 for the reciprocating saw blade 10 with the AlTiN coating and edge prepping of the substrate 44 was 12.6 cuts. In other words, the life of the reciprocating saw blade 10 is longer for the reciprocating saw blade 10 with the AlTiN coating and edge prepping of the substrate 44.

Figure 7B:
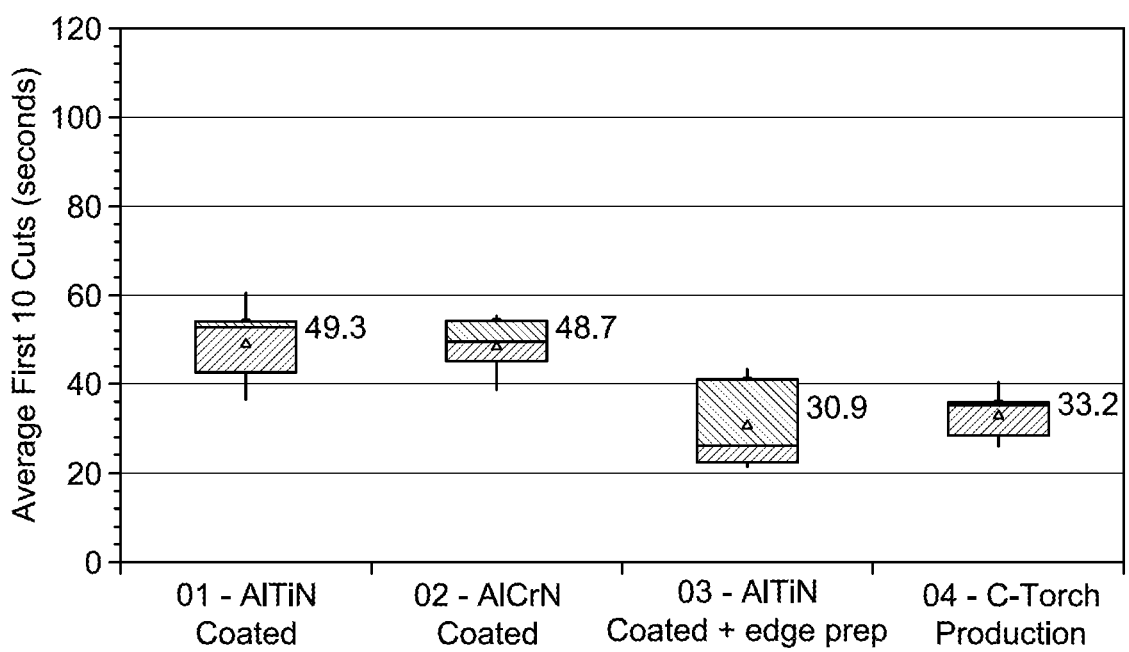
FIG. 7B is a graphical illustration of the cutting speed of the reciprocating saw blade of FIG. 7A when being used to cut stainless steel objects.

Similar to FIG. 7A, FIG. 7B illustrates a graph of the performance of the reciprocating saw blade 10 when the reciprocating saw blade 10 is used with the reciprocating saw 14 at full speed to cut the stainless steel pipe. FIG. 7B depicts how the speed of cutting the stainless steel pipe is affected by having differing coatings 74. The reciprocating saw blade 10 without the coating 74 ("04-C-Torch Production") can perform the average of the first ten cuts of the stainless steel pipe in 33.2 seconds. This can be compared to the reciprocating saw blade 10 with the AlTiN coating and edge prepping of the substrate 44 ("03-AlTiN Coated+edge prep"), which can perform the average of the first ten cuts of the stainless steel pipe in 30.9 seconds. In other words, the reciprocating saw blade 10 with the AlTiN coating and edge prepping of the substrate 44 cuts the stainless steel pipe faster than the reciprocating saw blade 10 without the coating 74.

Figure 8A:
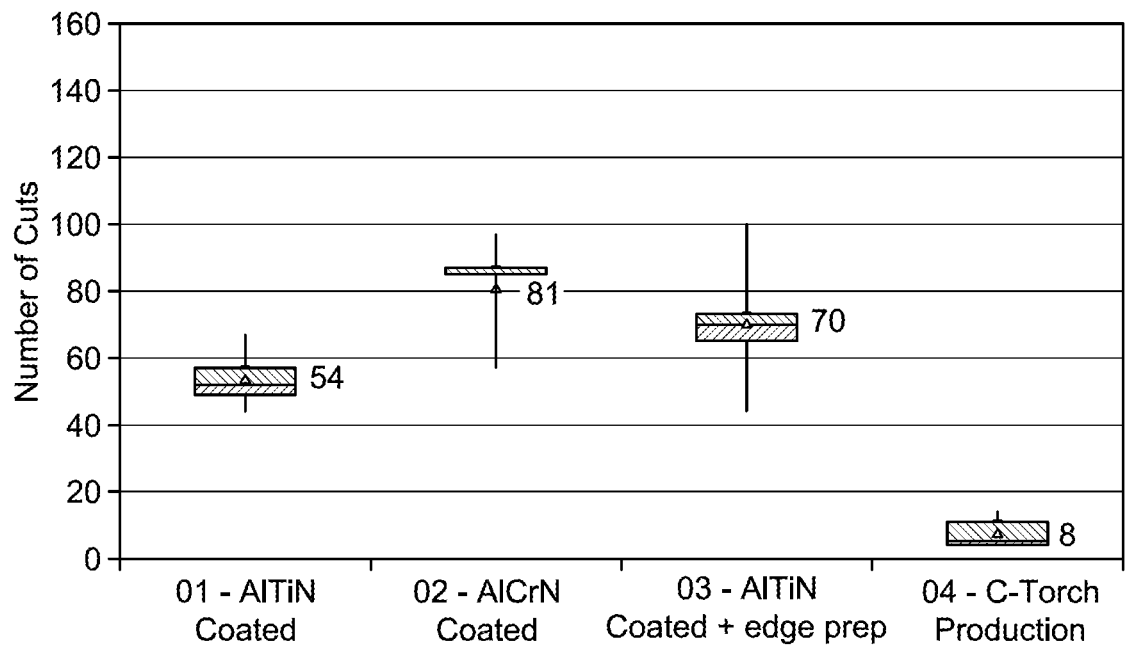
FIG. 8A is a graphical illustration of the lifetime of the reciprocating saw blade with different coatings when being used to cut cast iron objects.

FIG. 8A illustrates a graph of the performance of the reciprocating saw blade 10 when the reciprocating saw blade 10 is used with the reciprocating saw 14 at full speed to cut a cast iron. Specifically, FIG. 8A depicts how the life, or degradation, of the reciprocating saw blade 10 is affected by having differing coatings 74. The reciprocating saw blade 10 without the coating 74 ("04-C-Torch Production") can perform 8 cuts prior to significant degradation occurring. This can be compared with the reciprocating saw blade 10 with the AlCrN coating ("02-AlCrN Coated"), which performs 81 cuts prior to significant degradation occurring. The reciprocating saw blade 10 with the AlTiN coating ("01-AlTiN Coated" and "03-AlTiN Coated+edge prep"), with and without edge prepping of the substrate 44, also have a substantially improved performance compared to the reciprocating saw blade 10 without the coating 74. The AlTiN coating with and without edge prepping of the substrate 44 perform 54 cuts and 70 cuts, respectively. In other words, the coating 74 significantly improves the life of the reciprocating saw blade 10.

Figure 8B:
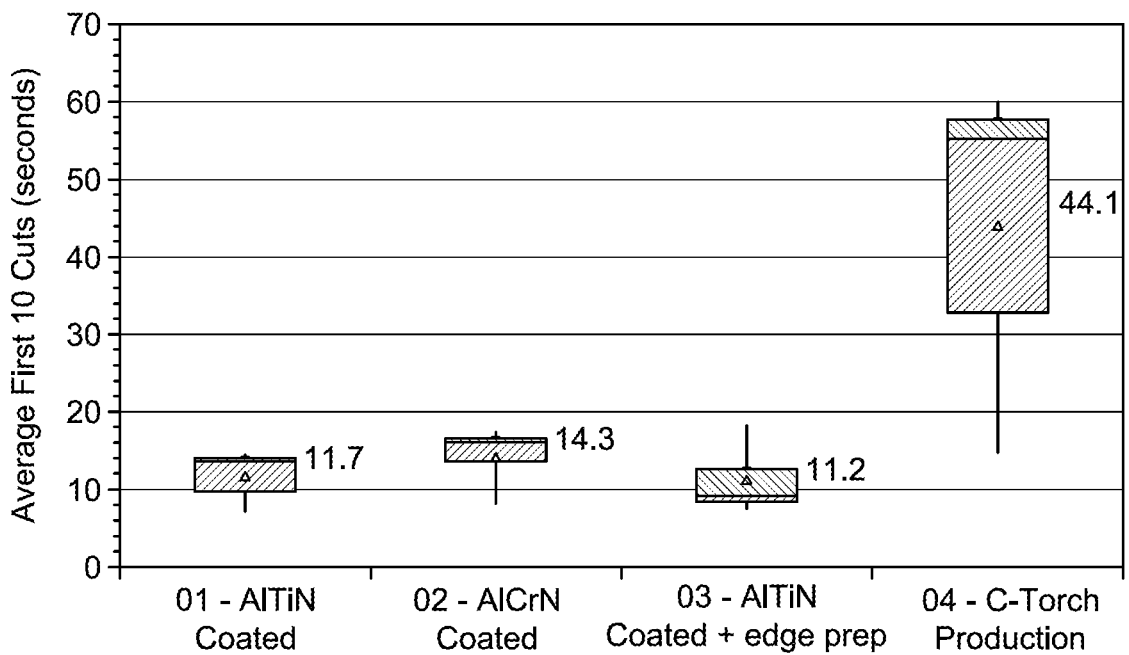
FIG. 8B is a graphical illustration of the cutting speed of the reciprocating saw blade of FIG. 8A when being used to cut cast iron objects.

Similar to FIG. 8A, FIG. 8B illustrates a graph of the performance of the reciprocating saw blade 10 when the reciprocating saw blade 10 is used with the reciprocating saw 14 at full speed to cut the cast iron. FIG. 8B depicts how the speed of cutting the cast iron is affected by having differing coatings 74. The reciprocating saw blade 10 without the coating 74 ("04-C-Torch Production") cuts an average of the first ten cuts in 44.1 seconds. This can be compared with the reciprocating saw blade 10 with the AlTiN coating ("01-AlTiN Coated" and "03-AlTiN Coated+edge prep"), with and without edge prepping of the substrate 44, which cuts the first ten cuts at an average rate of 11.7 second and 11.2 seconds, respectively. The reciprocating saw blade 10 with the AlCrN coating ("02-AlCrN Coated") also has an improved average speed of 14.3 second. In other words, the coatings 74 substantially improve the speed that the reciprocating saw blade 10 cuts the cast iron.

Figure 9A:
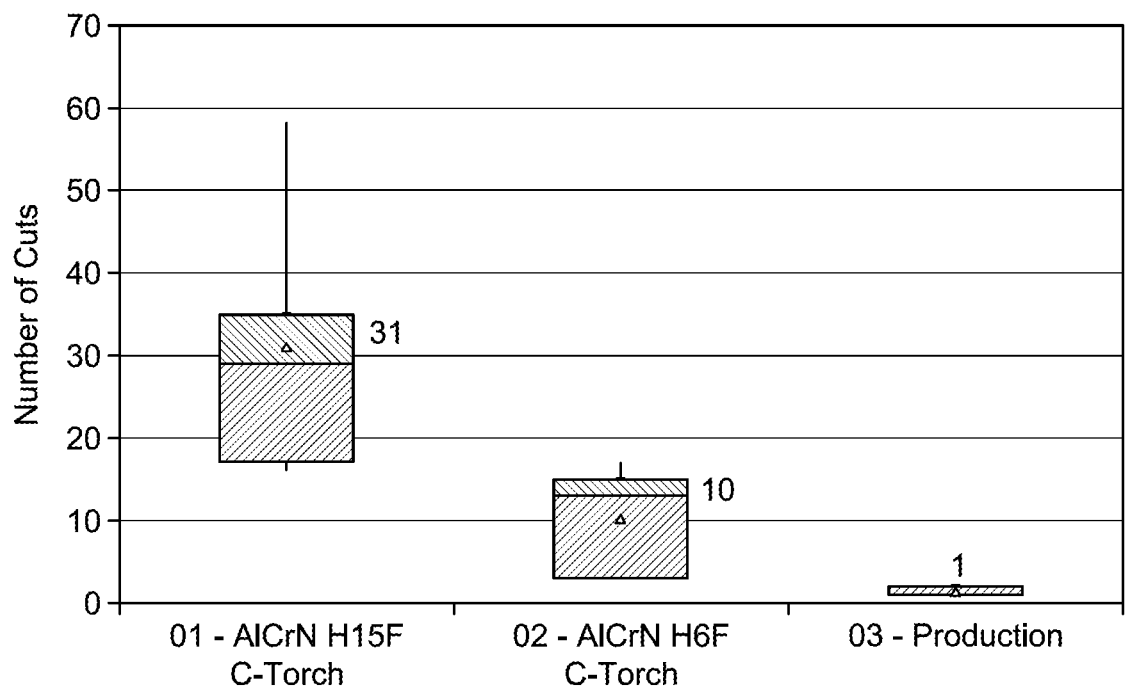
FIG. 9A is a graphical illustration of the lifetime of the reciprocating saw blade with different substrates and coatings when being used to cut hard cast iron objects.

FIG. 9A illustrates a graph of the performance of the reciprocating saw blade 10 when the reciprocating saw blade 10 is used with the reciprocating saw 14 at full speed to cut a hard cast iron. Specifically, FIG. 9A depicts how the life, or degradation, of the reciprocating saw blade 10 is affected by having AlCrN coating and differing substrates 44. The reciprocating saw blade 10 without the coating 74 ("03-Production") can perform 1 cut prior to significant degradation occurring. This can be compared with the H6F grade substrate with the AlCrN coating ("02-AlCrN H6F C-Torch"), which can perform 10 cuts prior to significant degradation occurring. The H15F grade carbide substrate with the AlCrN coating ("01-AlCrN H15F C-Torch") has an improved performance over the H6F grade carbide substrate of 31 cuts prior to degradation occurring. In other words, the AlCrN coating improves the life of the reciprocating saw blade 10, with the H15F grade carbide substrate having an improved life over the H6F grade carbide substrate.

Figure 9B:
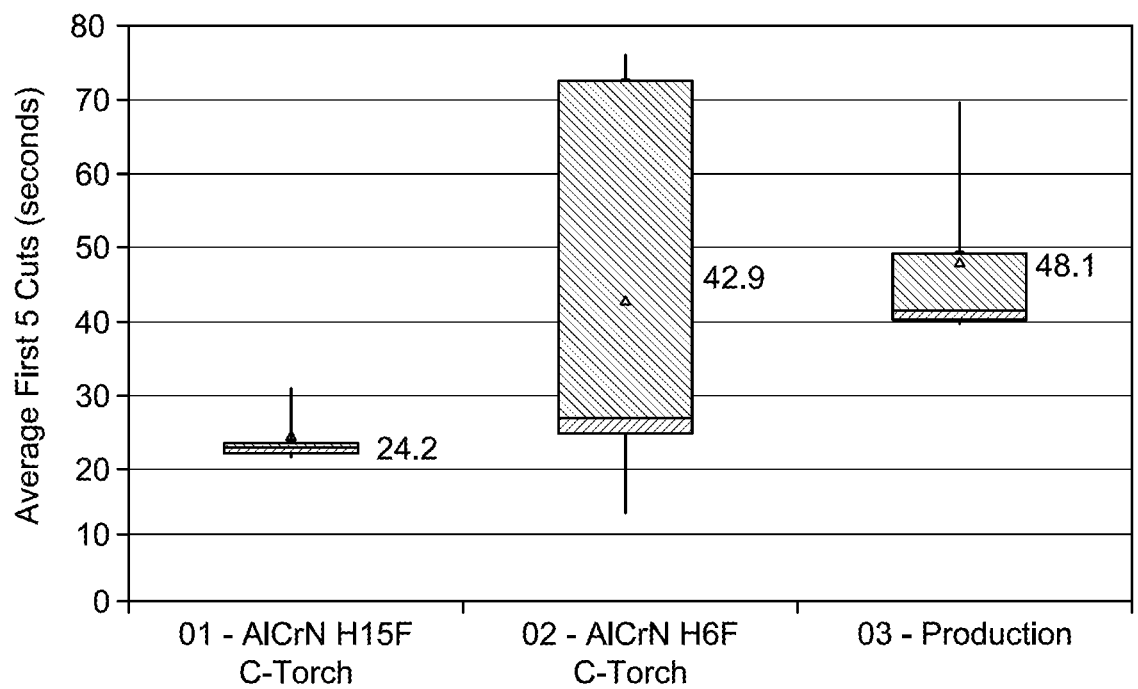
FIG. 9B is a graphical illustration of the cutting speed of the reciprocating saw blade of FIG. 9A when being used to cut hard cast iron objects.
Figure 10A:
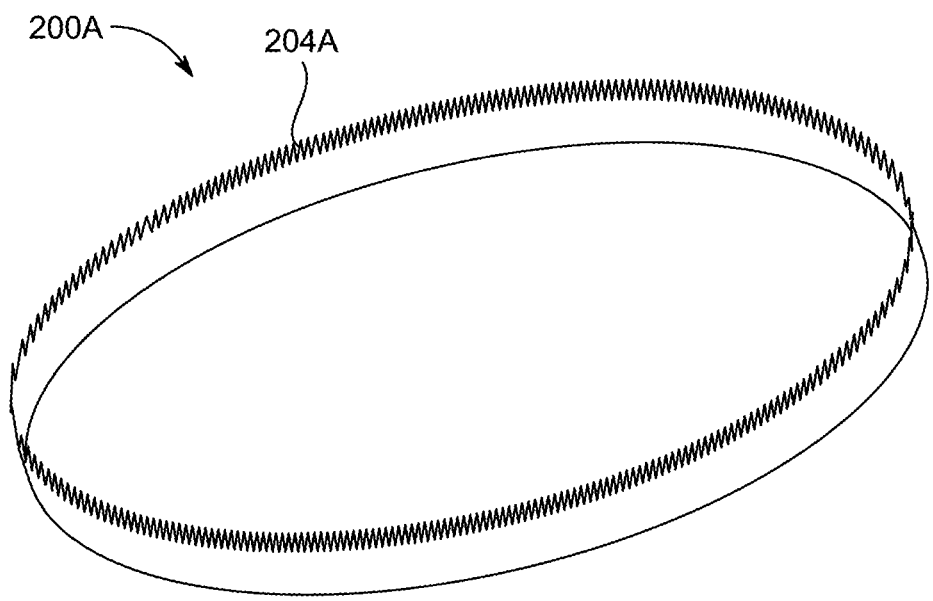
FIG. 10A is a perspective view of an alternative embodiment of the saw blade of FIG. 1, illustrating a band saw blade.
Figure 10B:
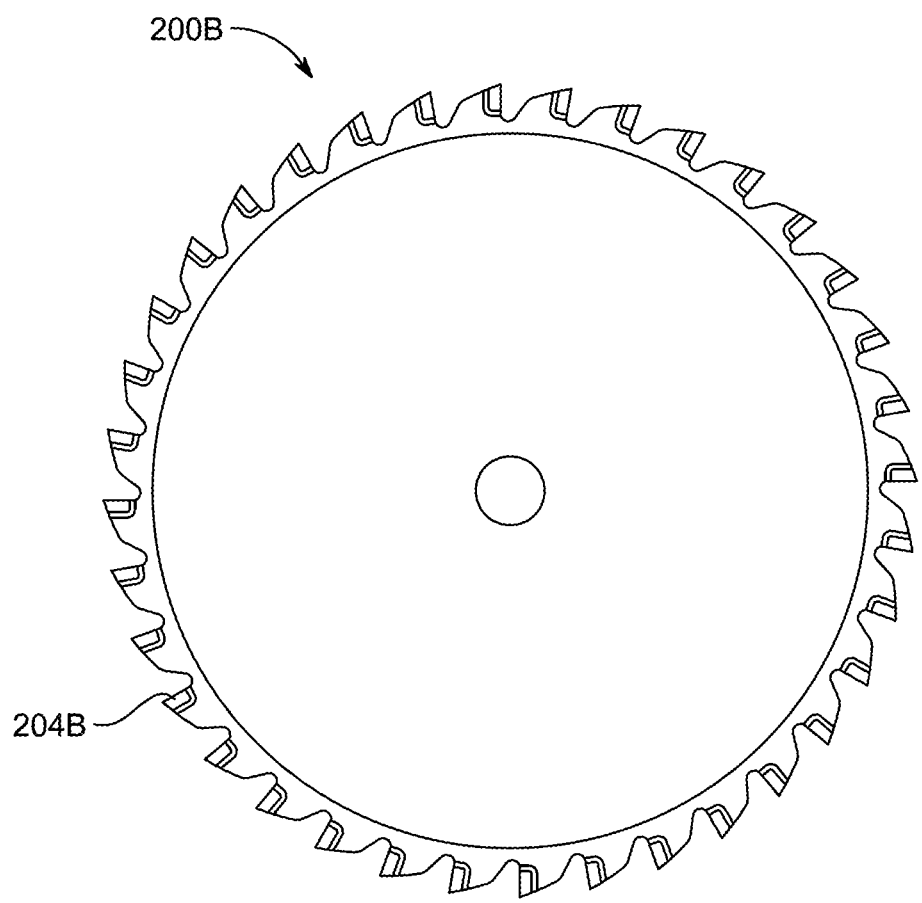
FIG. 10B is a perspective view of another alternative embodiment of the saw blade of FIG. 1, illustrating a circular saw blade.
Figure 10C:
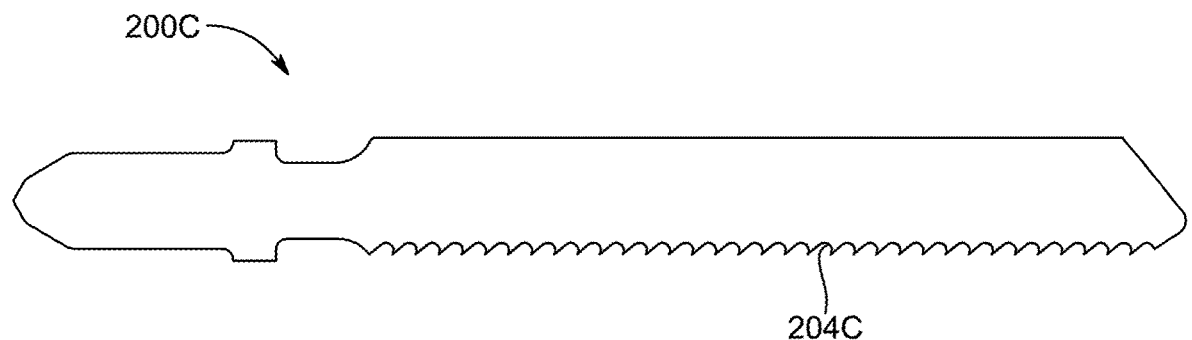
FIG. 10C is a perspective view of yet another alternative embodiment of the saw blade of FIG. 1, illustrating a jigsaw blade.
Figure 10D:
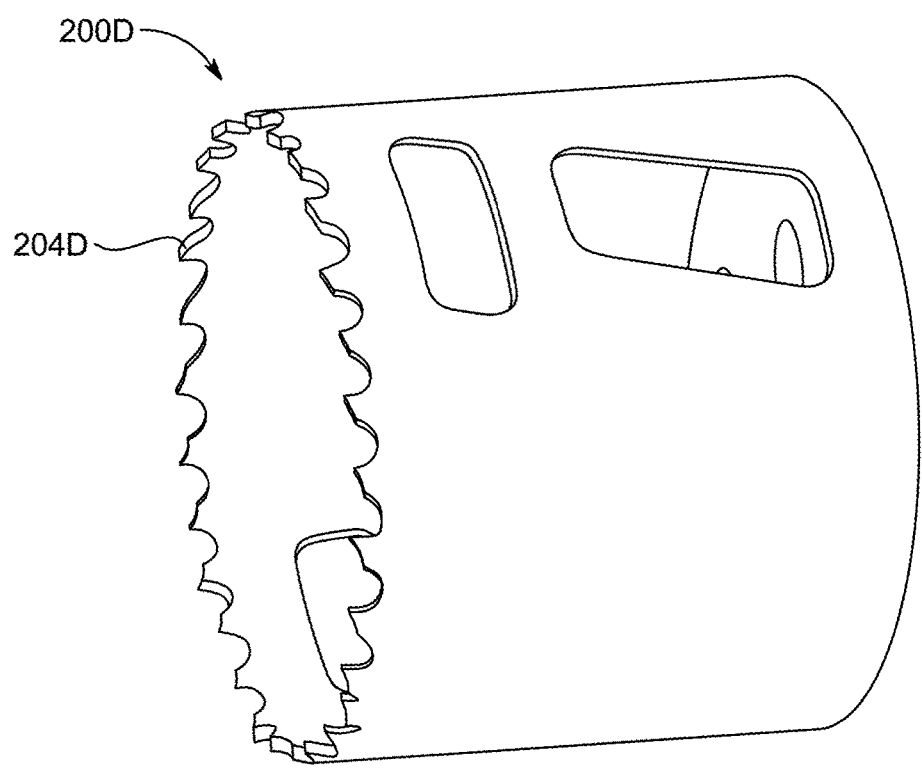
FIG. 10D is a perspective view of still yet another alternative embodiment of the saw blade of FIG. 1, illustrating a hole saw.
Figure 10E:
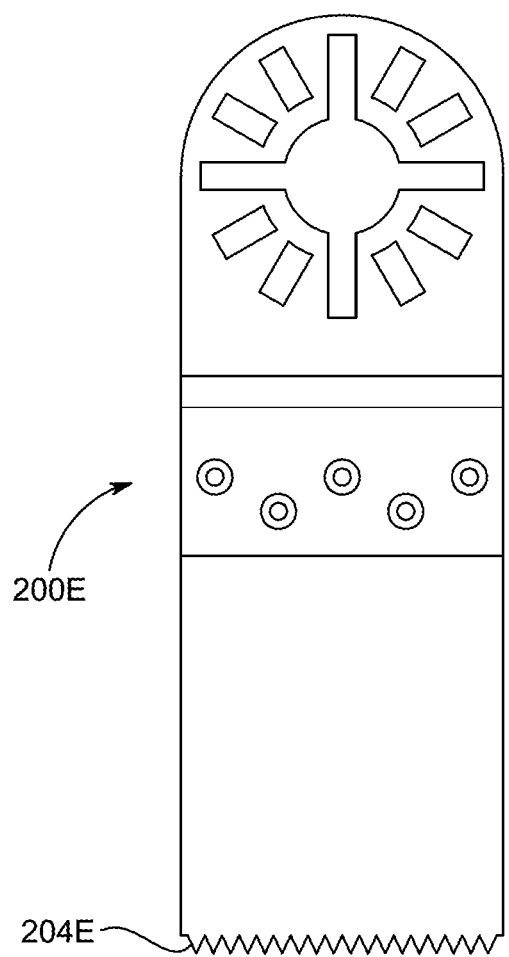
FIG. 10E is a perspective view of still yet another alternative embodiment of the saw blade of FIG. 1, illustrating an oscillating multi-tool blade.

Similar to FIG. 9A, FIG. 9B illustrates a graph of the performance of the reciprocating saw blade 10 when the reciprocating saw blade 10 is used with the reciprocating saw 14 at full speed to cut the hard cast iron. FIG. 9B depicts how the speed of cutting the hard cast iron is affected by having the AlCrN coating and differing substrates 44. The reciprocating saw blade 10 without the coating 74 ("03-Production") can perform the first 5 cuts at an average speed of 48.1 seconds. This can be compared with the AlCrN coating with the H6F grade carbide substrate ("02-AlCrN H6F C-Torch"), which can perform the first 5 cuts at an average speed of 42.9 seconds. The AlCrN coating with the H15F grade carbide substrate ("01-AlCrN H15F C-Torch") has an improved performance over the H6F grade carbide substrate. The H15F grade carbide substrate can perform the first 5 cuts at an average speed of 24.2 seconds. In other words, the AlCrN coating improves the cutting speed of the reciprocating saw blade 10, with the H15F grade carbide substrate having an improved cutting speed over the H6F grade carbide substrate.

When cutting both hard and soft materials, both the H10F grade carbide substrate and the H15F grade carbide substrate tend to perform better than the H6F grade carbide substrate. In other words, the grade of carbide used influences the performance of the coating 74. During testing, any thickness 78 of the coating 74 on the reciprocating saw blade 10 appeared to improve performance over the reciprocating saw blade 10 with no coating 74. In addition, all coatings 74 increase the performance of the reciprocating saw blade 10, although, the AlCrN coating has a slightly improved performance over the AlTiN coating. The AlTiCrN coating outperforms the AlCrN coating and the AlTiN coating when cutting hard cast iron, while the AlTiCrN coating performs similarly to the AlCrN coating and the AlTiN coating when cutting soft cast iron.

The substrate 44 combined with the coating 74 increases the performance of the reciprocating saw blade 10 in applications of both soft and hard cutting materials when compared with the reciprocating saw blade 10 without the coating 74. The substrate 44 combined with the coating 74 has beneficial effects by increasing the strength of the reciprocating saw blade 10 while also reducing the friction of reciprocating saw blade 10 with the material being cut, which reduces the heat buildup on the reciprocating saw blade 10. This heat buildup may degrade the teeth 34 of the reciprocating saw blade 10, reducing the lifetime of the reciprocating saw blade 10. The heat buildup is reduced due to the heat being dissipated quickly across the outer surface of the coating 74, such that the heat is conducted away from the cutting edge of each tooth 34. The coating 74 also protects the teeth 34 when cutting ferrous material by inhibiting carbon on carbon contact, which may result in sparking.

FIGS. 10A-10E illustrate blades 200A-200E in accordance with alternative embodiments of the invention. The blades include a bandsaw blade 200A usable with a bandsaw (FIG. 10A), a circular saw blade 200B usable with a circular saw (FIG. 10B), a jigsaw blade 200C usable with a jigsaw (FIG. 10C), a hole saw blade 200D usable with a rotary driver (10D), and an oscillating multi-tool blade 200E usable with a multi-tool (10E). Further embodiments may include additional blades not explicitly stated above. Similar to the reciprocating saw blade 10, the substrate 44 may be coupled to one or more cutting teeth 204A-204E of the respective blades. Further, the substrate 44 may be edge prepped to remove sharp edges and corners from the substrate 44. The blades 200A-200E may also include the coating 74. The coating 74 may overlay solely the substrate 44, may be disposed on solely the teeth 204A-204E, or may be disposed on the entirety of the respective blades 200A-200E.

The substrate 44 combined with the coating 74 increases the strength of the respective blades 200A-200E, while also reducing the friction of the blades 200A-200E with the material being cut. Therefore, the substrate 44 combined with the coating 74 when used with the blades 200A-200E produces effects similar to the effects of the substrate 44 and the coating 74 applied to the reciprocating saw blade 10, as described above. In addition, the substrate 44 and the coating 74 when applied to the blades 200A-200E may produce additional effects or benefits not demonstrated by the substrate 44 and the coating 74 when applied to the reciprocating saw blade 10.

Various features and advantages of the invention are set forth in the following claims.

The invention claimed is:
1. A saw blade comprising:
a body having a first end, a second end, and an edge extending between the first and second ends;

a tang coupled to the first end of the body and including an aperture, the tang and the aperture configured to couple the saw blade to a power tool;

a plurality of teeth extending from the edge of the body along substantially an entire length of the body and defining a cutting portion, each tooth of the plurality of teeth including a substrate forming a tip of each tooth; and a thin film ceramic coating overlaying an entirety of each tooth of the plurality of teeth, but not overlaying the body;

wherein the thin film ceramic coating has a greater strength than the substrate, wherein each substrate includes carbide and is edge prepped to refine a micro geometry of the plurality of teeth, wherein the thin film ceramic coating is applied after the substrates are edge prepped, and wherein a thickness of the thin film ceramic coating varies at locations where the substrates are edge prepped.

2. The saw blade of claim 1, wherein the body and the plurality of teeth form a single monolithic component.

3. The saw blade of claim 1, wherein the substrate is received by a pocket provided on the at least one tooth.

4. The saw blade of claim 1, wherein the thin film ceramic coating overlays the substrate on each of the plurality of teeth.

5. The saw blade of claim 1, wherein the thin film ceramic coating is applied to the substrate via physical vapor deposition.

6. The saw blade of claim 1, wherein the thin film ceramic coating has the thickness between approximately 3.0 micrometers and approximately 4.0 micrometers.

7. The saw blade of claim 6, wherein the thickness of the thin film ceramic coating is approximately 3.5 micrometers.

8. The saw blade of claim 1, wherein the thin film ceramic coating is composed of one selected from a group consisting of aluminum titanium nitride, aluminum chromium nitride, aluminum titanium chromium nitride, and titanium molybdenum nitride.

9. The saw blade of claim 1, wherein the thin film ceramic coating increases heat dissipation during a cutting operation.

10. The saw blade of claim 1, wherein the substrate is a separate component that is secured onto the at least one tooth via welding.

11. The saw blade of claim 1, wherein the substrate is composed of one selected from a group consisting of H6F grade carbide having a sub-micron grain size, H10F grade carbide having a sub-micron grain size, and H15F grade carbide having a sub-micron grain size.

12. The saw blade of claim 1, wherein the thin film ceramic coating is composed of an aluminum-based material.

13. The saw blade of claim 1, wherein the thin film ceramic coating is only applied to the entire cutting portion.

14. A saw blade comprising:

a body having an edge;

a tang coupled to the body and including an aperture, the tang and the aperture configured to couple the saw blade to a power tool;

a cutting portion disposed on the edge of the body and including a plurality of teeth extending along the edge, each tooth having a rake face, a relief face, a gullet, and a lip;

a plurality of substrates, each substrate coupled to the lip of one of the plurality of teeth to form a tip of the one of the plurality of teeth; and a thin film ceramic coating overlaying an entirety of the cutting portion, such that the rake face, the relief face, the gullet, the lip, and the substrate of each tooth along an entire length of the saw blade are covered by the thin film ceramic coating, wherein the thin film ceramic coating has a greater strength than the substrate, wherein each substrate is composed of tungsten carbide alloy having a sub-micron grain size and is edge prepped to refine a micro geometry of the plurality of teeth, wherein the thin film ceramic coating has a thickness between approximately 3.0 micrometers and approximately 4.0 micrometers, wherein the thin film ceramic coating is applied after the plurality of substrates are edge prepped, and wherein a thickness of the thin film ceramic coating varies at locations where the plurality of substrates is edge prepped.

15. The saw blade of claim 14, wherein the thin film ceramic coating overlays an entirety of the body.

16. The saw blade of claim 14, wherein the substrate is a separate component that is secured onto each tooth via welding.

17. The saw blade of claim 14, wherein the thin film ceramic coating is composed of one selected from a group consisting of aluminum titanium nitride, aluminum chromium nitride, aluminum titanium chromium nitride, and titanium molybdenum nitride.

18. The saw blade of claim 14, wherein the thin film ceramic coating is applied to the entire cutting portion, but not including the body.

* * * * *